SEMICONDUCTOR TRANSISTOR DEVICE

Filed March 24, 1955

WARREN P. WATERS
RICHARD A. GUDMUNDSEN
INVENTORS

BY Henry Hyman

ATTORNEY

United States Patent Office 2,854,610

Patented Sept. 30, 1958

2,854,610

SEMICONDUCTOR TRANSISTOR DEVICE

Warren P. Waters and Richard A. Gudmundsen, Inglewood, Calif., assignors to Hughes Aircraft Company, Culver City, Calif., a corporation of Delaware Application March 24, 1955, Serial No. 496,554

11 Claims. (Cl. 317—235)

Figures 1, 2, 3, 4, 5:
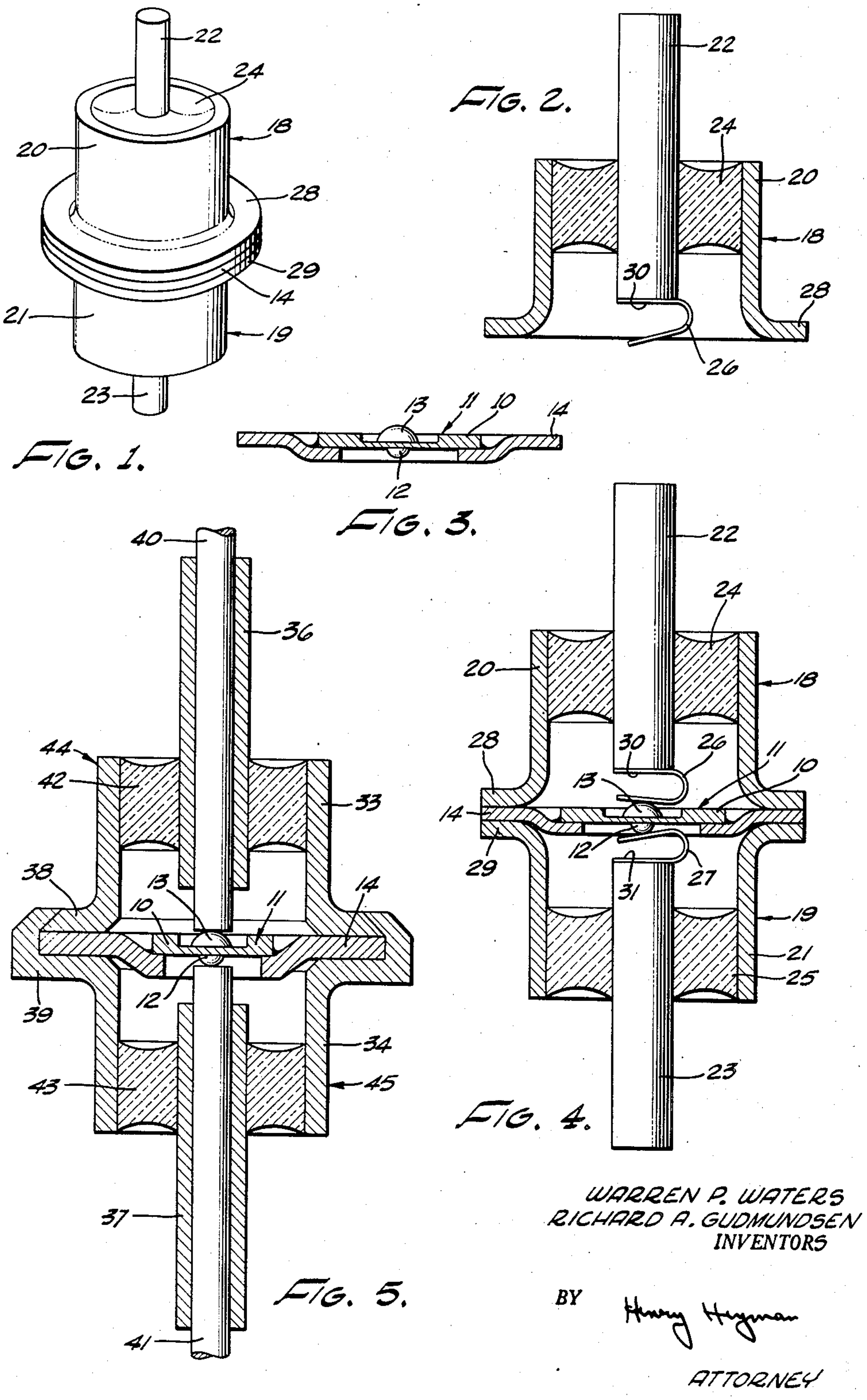

This invention relates to semiconductor signal translating devices and, more particularly, to a semiconductor transistor device.

In the semiconductor art, a region of a semiconductor material such as a semiconductor crystal containing an excess of donor impurities and having an excess of free electrons is considered to be an N-type region, while a P-type region is one containing an excess of acceptor impurities resulting in a deficit of electrons or, stated differently, an excess of holes. When a continuous solid specimen such as a crystal of semiconductor material has an N-type region adjacent a P-type region, the boundary between the two regions is termed a P–N junction, or simply a junction, and the specimen of semiconductor material is termed a P–N junction semiconductor device. A specimen having two N-type regions separated by a P-type region, for example, is termed an N–P–N junction semiconductor device or transistor, while a specimen having two P-type regions separated by an N-type region is termed a P–N–P junction semiconductor device or transistor.

The term, "monatomic semiconductor material," as utilized herein, is considered generic to both germanium and silicon, and is employed to distinguish these semiconductors from metallic oxide semiconductors, such as copper oxide and other semiconductors consisting essentially of chemical compounds.

The term, "active impurity," is used to denote those impurities which affect the electrical rectification characteristic of monatomic semiconductor material, as distinguishable from other impurities which have no appreciable effect upon these characteristics. Active impurities are ordinarily classified either as donor impurities—such as phosphorus, arsenic, and antimony—or as acceptor impurities—such as boron, aluminum, gallium, and indium.

Point contact transistors have been relatively long-known to the art, while junction transistors have become increasingly important through recent advances in the production of fused P–N junctions. The desirability of junction, or broad area, transistors is apparent and well known to those skilled in the art. The advantages of junction transistors include improvements in such characteristics as noise, power efficiency, operating voltage, power handling ability, and similar items, over the older point contact transistors.

Transistors of the type to which this invention pertains comprise a body of semiconductive material to which at least three separate connections are made. Where three connections are used, two are respectively on opposite sides of the semiconductor body, and a third is made to a portion of the body intermediate these sides. More specifically, in an N–P–N junction transistor or a P–N–P junction transistor, of the type described hereinbefore, the two connections are made at substantially opposite points of opposed faces of the parent crystal, and the third at an edge between these faces. Thus, in an N–P–N junction transistor, a first connection is made at one of the N-type regrown crystal regions, the second connection is made at the opposed N-type regrown crystal region, and the third connection is made at the surface of the P-type region which separates the two N-type regrown regions. If a relatively low voltage is applied between one opposed connection and the third connection so that a relatively low impedance is encountered, and a relatively high voltage is applied between the other opposed connection and the third connection so that a relatively high impedance is encountered, the current introduced at low impedance is extracted at high impedance and amplification results. The connection at which the current is introduced is known in the art as the "emitter" and the connection at which the current is extracted is known in the art as the "collector." The third connection is known as the "base" or "base electrode." The amplification of the transistor may be defined in terms of the short-circuit current amplification and is denoted as alpha.

The zero-emitter-bias collector current, $I_{co}$ is the current passing through the collector, and thus the current passing from the transistor, when the current introduced into the emitter is zero.

A significant problem in the production and use of transistors has been the effect of ambient temperatures upon the transistors, since there are three changes in transistor parameters at high operating temperatures. In all transistors, temperature has a marked effect upon many of the operating characteristics. The zero-emitter-bias collector current, $I_{co}$, increases exponentially with temperature and may rise several thousand percent from room temperature to temperatures of the order of 100° C. The short-circuit current amplification, alpha, may rise, stay relatively constant, or drop slightly, depending on the physical construction of the transistor. The collector resistance will drop, frequently one order of magnitude over the above temperature range.

Since $I_{co}$ is the minimum value of collector current, its increase reduces the available current variation for large signal operation and decreases the available output power and efficiency. Also, its change may change the operating point radically unless stabilization is provided by external circuits. Finally, the benefits of very low level operation may disappear at temperatures where $I_{co}$ is substantially increased. At sufficiently high temperatures the heat dissipation due to $I_{co}$ may even cause thermal runaway.

Since transistor action is extremely sensitive to the semiconductor crystal surface conditions, the reliability of transistors is greatly dependent upon chemical cleanliness. A well-designed transistor should, therefore, include materials which have stable chemical properties and which are conducive to the purest of chemical processes.

Accordingly, it is an object of the present invention to provide a semiconductor junction transistor device having power dissipation characteristics superior to those transistors presently known to the art.

It is another object of the present invention to provide a semiconductor junction transistor device having a path of high thermal conductivity from the semiconductor crystal to the transistor chassis or housing.

It is another object of the present invention to provide a junction transistor device which has a path of thermal conductivity from the P–N junctions through the base of the semiconductor crystal body.

It is another object of the present invention to provide a junction transistor device which may be easily connected to a thermal heat sink for improved dissipation of heat generated in the semiconductor crystal body.

It is another object of the present invention to provide a junction transistor device in which the thermal conductivity away from the semiconductor crystal is comparable to that of a solid conductor, while maintaining the required electrical insulation.

It is still another object of the present invention to provide a junction transistor device which lends itself to ease of manufacture and economy of production.

It is a further object of the present invention to provide a junction transistor device utilizing materials which have stable chemical properties.

It is a further object of the present invention to provide a junction transistor device which is hermetically sealed to attain minimum life-time leakage, pressure and vacuum tightness, and thermal shock resistance.

It is a still further object of the present invention to provide a junction transistor device which is of rugged construction and mechanically stable.

The device of the present invention comprises a parent semiconductor body of one conductivity type having an emitter junction on a first surface of the body and a collector junction on a second surface opposed to the first surface of the semiconductor body; the semiconductor body is affixed to an electrically conductive diaphragm which is positioned and affixed between a first and second flanged body portion; first and second electrical conductors extend through the respective body portions and are affixed thereto, but electrically insulated therefrom; and ohmically connected means are provided between the electrical conductors and the emitter and collector region of the semiconductor body, respectively.

The novel features which are believed to be characteristic of the invention, both as to its organization and method of operation, together with further objects and advantages thereof, will be better understood from the following description considered in connection with the accompanying drawing, in which two embodiments of the invention are illustrated by way of example. It is to be expressly understood, however, that the drawing is for the purpose of illustration and description only, and is not intended as a definition of the limits of the invention.

Fig. 1 is a perspective view of a completed junction transistor device produced in accordance with the present invention;

Figs. 2, 3, and 4 are cross-sectional views of a junction transistor device of the present invention in the various stages of assembly; and Fig. 5 is a cross-sectional view of an alternative embodiment of the present invention.

Referring now to the drawing, wherein like reference characters designate like or corresponding parts throughout the several views, Fig. 3 illustrates the diaphragm subassembly of the transistor device of the present invention. For purposes of illustration, the production of an N–P–N junction transistor in which germanium is utilized as the semiconductor body will be described. It will be recognized, however, that the completed transistor and the operational steps of assembly to be described may also be employed to produce P–N–P or N–P–N junction transistors in which germanium, silicon, or intermetallic semiconductors are used as the semiconductor body.

In the presently preferred embodiment of the transistor of the present invention, a P-type germanium crystal body 10, having N-type fused junction regions on opposed surfaces thereof, is used as the semiconductor transistor body 11. In the presently preferred embodiment, the semiconductor transistor body is formed by fusing a lead-arsenic alloy emitter pellet 12 to one surface of a P-type germanium square wafer 10 which is of the order of ⅛″ on a side and 0.012″ in thickness. The emitter pellet 12 is approximately 0.025″ in diameter and is fused to the surface of the germanium body 10 by methods well known to the art. In the present embodiment, a three minute heating cycle in which the temperature of the germanium body and the emitter pellet is raised to a temperature of approximately 725° C. in 45 seconds, and then cooled at a controlled rate, is used to fuse the lead arsenic pellet to the germanium body to produce the emitter P–N junction. The collector pellet 13, which is also a lead-arsenic alloy and is approximately 0.065″ in diameter, is similarly fused to the opposed surface of the germanium body 10 to form the collector P–N junction. The P-type base region between the emitter and collector junctions is then approximately 0.003″ in thickness. It will be noted that the collector junction has a larger area than the emitter junction, which is generally desirable.

After the N–P–N semiconductor transistor body 11 is formed, it is affixed to a diaphragm 14. The diaphragm 14 is a dish-shaped disc of electrically and thermally conductive material. In the present embodiment, "Kovar" is used as the material for the diaphragm 14 since it has a coefficient of expansion substantially equal to the coefficient of expansion of germanium. The diaphragm 14 is approximately 0.010″ in thickness and has an outside diameter of 0.280″. The diaphragm defines an opening symmetrical about the centerline which has a diameter substantially less than the width of the transistor body 11 but greater than the diameter of the larger P–N junction of the body. In the present embodiment, an opening of approximately 0.1″ is used. The semiconductor transistor body 11 is affixed to the dished surface of the diaphragm with the centerline of the emitter and collector junctions substantially coincident with the longitudinal centerline of the diaphragm 14. Gold paste, solder, or other thermally conductive materials well known to the art are used to affix the semiconductor body 10 to the diaphragm 14.

Referring now to Figs. 1, 2, and 4, first and second envelope subassemblies 18, 19 are similar in configuration and comprise a body portion 20, 21, an associated electrical conductor 22, 23, an insulative bond 24, 25 between the body portion and the electrical conductor, and a contact electrode 26, 27 which is ohmically connected to electrical conductors 22, 23. The body portion 20, 21 is a hollow cylinder of thermally conductive material having open ends and an outwardly directed right angle flange 28, 29 at one end thereof. The outer diameter of the flange 28, 29 is approximately equal to the outside diameter of the diaphragm 14, while the outer diameter of the cylinder is substantially less than the outer diameter of the flange. In the present embodiment, the cylinder has an outside diameter of the order of 0.2″ and a flange diameter of the order of 0.280″. The present embodiment of the body portion 20, 21 is made of 0.010 inch "Kovar" stock, which is punched or spun, to form the flanged cylindrical body portion.

The electrical conductor 22, 23 is a "Kovar" rod or wire having a diameter of the order of 0.05″, and is affixed within the body portion 18, 19 and insulated therefrom by the insulative bond 24, 25. The centerline of the electrical conductor 22, 23 is substantially coincident with the longitudinal centerline of the body portion 20, 21, and has its inner end 30, 31 within the body portion and of the order of 0.03″ from the plane of the flange 28, 29. Glass-to-metal sealing methods, which are well known to the art (see, for example, "Glass-to-Metal Seals," by Albert W. Hall and E. E. Burger, "Physics," 5–384, December 1934), are utilized to affix the electrical conductor within the body portion while insulating it therefrom. The insulative bond 24, 25 also forms a hermetic seal between the electrical conductor 22, 23 and the inside diameter of the metallic body portion 20, 21.

The contact electrode 26, 27 is a C-shaped spring 0.03″ in width, formed from "Kovar" stock which is 0.005″ in thickness. The contact electrode 26, 27 is spot welded to the inner end of the electrical conductor 30, 31 to form an ohmic contact therewith. The contact electrode is of sufficient length, and is formed with a sufficient radius, to extend beyond the plane of the flange 28, 29 when the electrode is in a relaxed position, as clearly shown in Fig. 2. The surfaces of the contact electrode are then pre-tinned with a layer of 50–50 lead-tin solder.

The first and second envelope subassemblies 18, 19 and the diaphragm 14, with the semiconductor body 11 affixed thereto, are then assembled by positioning the three subassemblies along a common longitudinal centerline with the diaphragm positioned between mating surfaces of the flanges 28, 29 of the envelope subassemblies. The outer diameter of the diaphragm 14 and the diameter of the flanges 28, 29 are substantially equal, as described hereinbefore. The subassemblies are joined to form the final assembly by welding the extended flanges and the sandwiched diaphragm to form a hermetic seal between the three subassemblies. The flanges may be spot, seam, or projection welded by methods well known to the art, or if the transistor device is to be utilized only at relatively low operating temperatures, the flanges and diaphragm may be soldered. Since the contact electrodes, in a relaxed configuration, extend beyond the plane of the flanges, they are in spring contact with the emitter and collector pellet, respectively, when the subassemblies are joined.

To effect the final sealing operation of the transistor device, the electrical conductors 22, 23 are heated to a sufficient temperature to cause the pre-tinned contact electrodes 26, 27 to be ohmically connected to the emitter pellet 12 and the collector pellet 13, respectively. It should be noted that the materials used throughout the device have substantially equal coefficients of expansion in order that the device may be subjected to radical temperature variations without affecting the assembly or operation of the device. Referring now particularly to Fig. 1, the completed transistor, according to the described embodiment, is shown. Lead wires may then be ohmically connected to the electrical conductors 22, 23 for circuit operation. If a third conductor is to be utilized as a base electrode, a lead wire may be ohmically connected to any point upon the flange of the assembled transistor device. The transistor device of the present invention is mechanically rugged and due to the coaxial symmetry of construction is readily adaptable to circuit applications.

Difficulties encountered during operation of a transistor assembly at relatively high ambient temperatures, due to a rise in the value of $I_{co}$, are minimized in the present transistor device due to the excellent thermal conductivity away from the P–N junction regions through the crystal body and diaphragm, and thus through the flanges and body portion of the transistor assembly. It has been found that the described transistor device, when affixed to a suitable heat sink, will dissipate 30 mw./° C. compared to dissipation of 5 mw./° C. for the transistor devices of the prior art under similar conditions of operation.

Referring now to Fig. 5, an alternative embodiment of the present invention is illustrated. In the alternative embodiment, the body portions 33, 34, the diaphragm 14, and the electrical conductors 36, 37 are made from cold rolled steel, rather than "Kovar" which is utilized in the foregoing embodiment. In the alternative embodiment, the body portions 33, 34 are again hollow cylinders having open ends and an outwardly extending right angle flange at one end thereof. The flange 38 of the first body portion 33 is again substantially equal in outside diameter to the outside diameter of the diaphragm 14; however, the flange 39 of the second body portion 34 is substantially greater in outside diameter than the flange of the first body portion by an amount sufficient to allow crimping of the second flange 39 over the diaphragm 14 and the first flange 38, as shown. The cold rolled steel body portions 33, 34 are most easily formed on a screw machine by methods well known to the art and are formed from 20 mil cold rolled steel stock.

The semiconductor transistor 11 body is formed as described hereinbefore and is affixed to an electrically and thermally conductive dished circular diaphragm 14, which in this embodiment is also cold rolled steel. The electrical conductors 36, 37 are again affixed and positioned within the respective body portions as described hereinbefore. However, since for optimum results, similar material is used throughout the transistor assembly in order to match thermal expansion and contraction of the various parts, cold rolled steel is used in this embodiment. The electrical conductors 36, 37 are of the order of 0.06" in outside diameter and are hollow, having an inside diameter of the order of 0.03".

Since cold rolled steel of high structural strength is utilized in this embodiment, it has been found advantageous for production purposes to affix and seal the electrical conductors 36, 37 within their respective body portions, by utilizing a sintered glass insulative bond 42, 43 which is formed under high pressure to effect the insulative seal between the electrical conductor 36, 37 and the inside diameter of the body portion 33, 34. After the envelope subassemblies 44, 45 are completed, the inside surface of the electrical conductors 36, 37 and the surfaces of the flanges 38, 39 are tinned. The first and second body subassemblies are then mated with the diaphragm subassembly positioned between the flanges and the device is assembled and hermetically sealed by crimping the flange 39 over the flange 38 and the diaphragm 14. The flanges are crimped at high pressures and a cold weld is obtained between the mating surfaces of the respective flanges and the diaphragm.

The assembly of the transistor device is then completed by inserting contact electrodes 40, 41 having an outside diameter substantially equal to, but less than, the inside diameter of the electrical conductors 36, 37, through the conductors to contact the emitter pellet 12 and collector pellet 13. The electrodes are pre-tinned on their ends and ohmic contact between the electrodes and the emitter and collector circuits is effected by heating the electrodes to cause them to be ohmically affixed to the emitter and collector regions of the transistor body 11. Since the inside surface of the electrical conductors 36, 37 is also pre-tinned, the heat causes the electrodes 40, 41 to be hermetically sealed within the conductors and a hermetically sealed transistor device is obtained. For optimum performance, the material of the contact electrodes 40, 41 should have a coefficient of expansion substantially equal to the coefficient of expansion of the electrical conductors 36, 37 which in the described embodiment are cold rolled steel.

It will be apparent to those sklled in the art that many materials will be suitable for the transistor device of the present invention; however, the materials should be matched with respect to their coefficients of expansion in order to obtain optimum results.

Thus, the present invention provides an improved transistor device of rugged coaxial construction which, due to its increased power dissipation capabilities, minimizes the effect of ambient temperature upon its operating characteristics through a wide range of operating temperatures. The transistor device lends itself to economical production and assembly methods and results in a reliable transistor which is impervious to moisture and readily adaptable to a multitude of circuit arrangements.

What is claimed:

1. In a transistor device containing a semiconductor transistor body within a hermetically sealed envelope, a portion of said envelope comprising: an electrically conductive metallic cylinder, said cylinder having first and second open ends, said first end of said cylinder forming a flange of substantially greater diameter than the diameter of said cylinder; an electrical conductor extending through said second open end of said cylinder and terminating within said cylinder; and insulative sealing means affixed between said electrical conductor and said cylinder.

2. In a semiconductor translating device having a semiconductor translating body therein, a housing for said translating device comprising: a hollow envelope of thermally conductive material, said envelope having a radially increased portion on the longitudinal surface thereof; a thermally and electrically conductive mounting member within said envelope affixed to said envelope at said radially increased portion thereof, said mounting member having an opening therethrough; first and second electrically conductive means extending through opposed ends of said envelope; and insulative sealing means affixed between said envelope and said electrically conductive means.

3. In a transistor device having a transistor body therein, a housing for said transistor device comprising: a hollow envelope of thermally conductive metallic material, said envelope having a radially increased portion on the longitudinal surface thereof; a mounting member within said envelope affixed to said envelope at said radially increased portion thereof, said mounting member being formed of the metallic material of said envelope and having an opening therethrough; first and second electrically conductive means extending through opposed ends of said envelope, said electrically conductive means being formed of the metallic material of said envelope; and insulative sealing means affixed between said envelope and said electrically conductive means.

4. A semiconductor translating device comprising: a hollow envelope of thermally conductive material, said envelope having a radially increased portion on the longitudinal surface thereof; a thermally and electrically conductive mounting member within said envelope affixed to said envelope at said radially increased portion, said mounting member having an opening therethrough; a semiconductor translating body affixed to said mounting member, said translating body being substantially greater in area than said opening through said mounting member and having a rectifying region on at least one surface of said semiconductor translating body; first and second electrically conductive means extending through said envelope, said electrically conductive means making ohmic contact with said semiconductor translating body; and insulative sealing means affixed between said envelope and said electrically conductive means.

5. A transistor device comprising: a hollow envelope of thermally conductive material, said envelope having a radially increased portion on the longitudinal surface thereof; a thermally and electrically conductive mounting member within said envelope affixed to said envelope at said radially increased portion, said mounting member having an opening therethrough; a semiconductor transistor body affixed to said mounting member, said transistor body being substantially greater in area than said opening through said mounting member and having a base region and collector and emitter regions on opposed surfaces of said base region; first and second electrically conductive means extending through said envelope, said electrically conductive means making ohmic contact with said collector and emitter regions of said transistor body; and insulative sealing means affixed between said envelope and said electrically conductive means.

6. A transistor device comprising: a hollow metallic envelope, said envelope having open ends and a radially increased portion on the longitudinal surface thereof; a metallic mounting member within said envelope affixed to said envelope at said radially increased portion, said mounting member having an opening therethrough; a semiconductor transistor body affixed to said mounting member, said transistor body being substantially greater in area than said opening through said mounting member and having a base region and collector and emitter regions on opposed surfaces of said base region; first and second electrically conductive means extending through said envelope, said electrically conductive means making ohmic contact with said collector and emitter regions of said transistor body; and insulative sealing means affixed between said envelope and said electrically conductive means.

7. A transistor device comprising: a hollow envelope of electrically and thermally conductive material, said envelope having open ends and a radially increased portion on the longitudinal surface thereon; a thermally and electrically conductive mounting member within said envelope affixed to said envelope at said radially increased portion, said mounting member being of the same material as said envelope and having an opening therethrough; a semiconductor transistor body affixed to said mounting member, said transistor body being substantially greater in area than said opening through said mounting member and having a base region and collector and emitter regions on opposed surfaces of said base region; first and second electrically conductive means extending through said envelope, said electrically conductive means making ohmic contact with said collector and emitter regions of said transistor body; and insulative and hermetic sealing means affixed between said envelope and said electrically conductive means at said open ends of said envelope.

8. A transistor device comprising: a hollow cylindrical envelope of metallic thermally conductive material, said envelope having open ends and a flanged portion on the longitudinal surface thereon proximate the midpoint of said longitudinal surface; a thermally and electrically conductive metallic mounting member within said envelope affixed to said envelope at said flanged portion, said mounting member having an opening therethrough substantially symmetrical about the longitudinal centerline of said hollow cylinder; a semiconductor transistor body affixed to said mounting member substantially symmetrical about said centerline, said transistor body being substantially greater in area than said opening through said mounting member and having a base region and collector and emitter regions on opposed surfaces of said base region; first and second electrically conductive means extending through said envelope substantially coincident with the longitudinal centerline thereof, said electrically conductive means making ohmic contact with said collector and emitter regions of said transistor body; and insulative and hermetic sealing means affixed between said envelope and said electrically conductive means at said open ends of said envelope.

9. A transistor device comprising: a hollow cylindrical envelope of thermally conductive material, said envelope comprising a first and second cylindrical segment, said first and second cylindrical segments being substantially equal right angle cylinders having open ends and a right angle flange at one end thereof; a mounting member of electrically and thermally conductive material, said mounting member being a circular disk having an outside diameter substantially equal to the outside diameter of said flange on said first and second cylindrical segments, said mounting member defining an opening therethrough substantially symmetrical about the center thereof; said mounting member being affixed between mated flanges of said first and second cylindrical segments, a mating surface of said flange of said first segment being electrically connected and hermetically sealed to a first surface of said mounting member, a mating surface of said flange of said second segment being electrically connected and hermetically sealed to a second surface of said mounting member; a semiconductor transistor body affixed to said mounting member substantially symmetrical about said centerline, said transistor body being substantially greater in area than said opening through said mounting member and having a base region and collector and emitter regions on opposed surfaces of said base region; first and second electrically conductive means extending through said first and second cylindrical segments, respectively, substantially coincident with the longitudinal centerline thereof, said electrically conductive means making ohmic contact with said collector and emitter regions of said transistor body; and insulative and hermetic sealing means affixed between said open end of said first and second cylindrical segments and said first and second electrically conductive means, respectively.

10. A semiconductor translating device comprising: a hollow cylindrical envelope of thermally and electrically conductive metallic material, said envelope comprising a first and second cylindrical segment, said first and second cylindrical segments being substantially equal right angle cylinders having open ends and a right angle flange at one end thereof; a mounting member of the electrically and thermally conductive material of said envelope, said mounting member being a circular disk having an outside diameter substantially equal to the outside diameter of said flange on said first and second cylindrical segments, said mounting member defining an opening therethrough substantially symmetrical about the centerline thereof; said mounting member being affixed between mated flanges of said first and second cylindrical segments, a mating surface of said flange of said first segment being electrically connected and hermetically sealed to a first surface of said mounting member, a mating surface of said flange of said second segment being electrically connected and hermetically sealed to a second surface of said mounting member; a transistor body affixed to said mounting member substantially symmetrical about said centerline, said transistor body being substantially greater in area than said opening through said mounting member and having a base region and collector and emitter regions on opposed surfaces of said base region; first and second electrically conductive means extending through said first and second cylindrical segments, respectively, substantially coincident with the longitudinal centerline thereof, said electrically conductive means being formed of the electrically and thermally conductive material of said envelope, said electrically conductive means making ohmic contact with said transistor body; and a vitreous bond affixed between said open end of said first and second cylindrical segments and said first and second electrically conductive means, respectively, whereby said open ends of said envelope are hermetically sealed.

11. A semiconductor transistor device comprising: a hollow cylindrical envelope of thermally and electrically conductive metallic material, said envelope ocmprising a first and second cylindrical segment, said first and second cylindrical segments being substantially equal right angle cylinders having open ends and a right angle flange at one end thereof; a mounting member of the material of said envelope, said mounting member being a circular disk having an outside diameter substantially equal to the outside diameter of said flange on said first and second cylindrical segments, said mounting member defining an opening therethrough substantially symmetrical about the centerline thereof; said mounting member being affixed between mated flanges of said first and second cylindrical segments, a mating surface of said flange of said first segment being electrically connected and hermetically sealed to a first surface of said mounting member, a mating surface of said flange of said second segment being electrically connected and hermetically sealed to a second surface of said mounting member; a semiconductor transistor body affixed to said mounting member substantially symmetrical about said centerline, said transistor body being substantially greater in area than said opening through said mounting member and having a base region and collector and emitter regions on opposed surfaces of said base region; first and second electrically conductive means extending through said first and second cylindrical segments, respectively, substantially coincident with the longitudinal centerline thereof, said electrically conductive means being formed of the material of said envelope; a first and second metallic electrode ohmically connected between said first and second electrically conductive means and said collector and emitter regions of said transistor body, respectively; and a vitreous bond affixed between said open end of said first and second cylindrical segments and said first and second electrically conductive means, respectively, whereby said open ends of said envelope are hermetically sealed.

References Cited in the file of this patent

UNITED STATES PATENTS

| | | |
|---|---|---|
| 2,644,852 | Dunlap | July 7, 1953 |
| 2,644,914 | Kircher | July 7, 1953 |
| 2,672,528 | Shockley | Mar. 16, 1954 |
| 2,720,617 | Sardella | Oct. 11, 1955 |
| 2,744,218 | Burton et al. | May 1, 1956 |
| 2,754,455 | Pankove | July 10, 1956 |
| 2,762,956 | Ingraham | Sept. 11, 1956 |
| 2,765,516 | Haegele | Oct. 9, 1956 |
| 2,777,974 | Brattain et al. | Jan. 15, 1957 |
| 2,794,942 | Cooper | June 4, 1957 |
| 2,808,543 | Cooper | Oct. 1, 1957 |